(12) United States Patent
Hussain et al.

(10) Patent No.: US 11,569,154 B2
(45) Date of Patent: Jan. 31, 2023

(54) INTERDIGITATED OUTWARD AND INWARD BENT LEADS FOR PACKAGED ELECTRONIC DEVICE

(71) Applicant: Texas Instruments Incorporated, Dallas, TX (US)

(72) Inventors: Mohammad Waseem Hussain, Irving, TX (US); Anis Fauzi Bin Abdul Aziz, Berendam (MY)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 77 days.

(21) Appl. No.: 17/331,818

(22) Filed: May 27, 2021

(65) Prior Publication Data

US 2022/0384317 A1 Dec. 1, 2022

(51) Int. Cl.
*H01L 23/495* (2006.01)
*H01L 21/48* (2006.01)
*H01L 23/00* (2006.01)
*H01L 23/31* (2006.01)

(52) U.S. Cl.
CPC .... *H01L 23/49555* (2013.01); *H01L 21/4842* (2013.01); *H01L 23/3107* (2013.01); *H01L 24/48* (2013.01); *H01L 2224/48177* (2013.01)

(58) Field of Classification Search
CPC ................................................ H01L 23/49555
USPC ........................................................ 257/676
See application file for complete search history.

(56) References Cited

U.S. PATENT DOCUMENTS

| | | | |
|---|---|---|---|
| 6,914,332 B2 | 7/2005 | Zuniga-Ortiz et al. | |
| 9,013,032 B2 | 4/2015 | Koduri | |
| 10,840,171 B2 | 11/2020 | Meyers et al. | |
| 2006/0049492 A1 | 3/2006 | Holloway et al. | |
| 2006/0237828 A1 | 10/2006 | Robinson et al. | |
| 2008/0029907 A1 | 2/2008 | Koduri | |
| 2011/0024895 A1 | 2/2011 | Koduri et al. | |
| 2011/0033985 A1 | 2/2011 | Udompanyavit et al. | |
| 2012/0086112 A1 | 4/2012 | Amaro et al. | |
| 2012/0126385 A1 | 5/2012 | Koduri | |
| 2012/0217044 A1 | 8/2012 | Koduri | |
| 2013/0307117 A1 | 11/2013 | Koduri | |
| 2014/0008737 A1 | 1/2014 | Koduri | |
| 2014/0124939 A1 | 5/2014 | Romig et al. | |
| 2015/0228566 A1 | 8/2015 | Koduri | |
| 2016/0148876 A1* | 5/2016 | Kitnarong | H01L 22/14 257/666 |
| 2018/0301403 A1 | 10/2018 | Morroni et al. | |
| 2019/0109016 A1 | 4/2019 | Koduri | |
| 2019/0109076 A1 | 4/2019 | Koduri | |
| 2019/0109108 A1 | 4/2019 | Koduri | |
| 2019/0139869 A1* | 5/2019 | Danny Koh | H01L 23/49541 |

* cited by examiner

*Primary Examiner* — Ajay Arora
(74) *Attorney, Agent, or Firm* — Ronald O. Neerings; Frank D. Cimino (57) ABSTRACT

An electronic device includes a package structure, a first lead and a second lead. The first lead has a first portion extending outward from a side of the package structure and downward, and a second portion extending outward from the first portion away from the package side. The second lead has a first portion extending outward from the package side and downward, and a second portion extending inward from the first portion toward the package side, and a distal end of the second lead is spaced from the package side.

20 Claims, 6 Drawing Sheets

INTERDIGITATED OUTWARD AND INWARD BENT LEADS FOR PACKAGED ELECTRONIC DEVICE

BACKGROUND

Integrated circuit (IC) packages for surface mount technology, such as small outline integrated circuit (SOIC) and plastic leaded chip carrier (PLCC) packages have J-type leads that are bent inward under the package bottom or gullwing-type leads that are bent outward. J-type leads can help reduce the footprint of an IC on a printed circuit board (PCB) but inhibit the use of bottom side thermal pads. Moreover, trends toward lowering IC manufacturing cost and reducing package sizes. Reducing the pitch spacing between adjacent leads helps reduce package cost but some design requirements have minim pitch spacing limits.

SUMMARY

In one aspect, an electronic device has a package structure, a first lead and a second lead. The package structure has opposite first and second sides spaced from one another along a first direction, as well as opposite third and fourth sides spaced from one another along a second direction that is orthogonal to the first direction. The first lead has a first portion extending outward from the third side along the second direction and downward toward a plane of the first side and away from a plane of the second side. The first lead has a second portion extending outward from the first portion a direction away from the third side. The second lead is spaced from the first lead along a third direction orthogonal to the first and second directions. The second lead has a first portion extending outward from the third side along the second direction and downward toward the plane of the first side and away from the plane of the second side. The second lead has a second portion extending inward from the first portion of the second lead in a direction toward the third side, and the second lead has a distal end spaced from the third side along the second direction.

In another aspect, an electronic device has a package structure, first and second leads and a conductive pad. The package structure has opposite first and second sides spaced from one another along a first direction, as well as opposite third and fourth sides spaced from one another along a second direction that is orthogonal to the first direction. The first lead extends outward from the third side along the second direction. The second lead has a first portion extending outward from the third side along the second direction and downward toward the plane of the first side and away from the plane of the second side. The second lead has a second portion extending inward from the first portion in a direction toward the third side, and a distal end of the second lead is spaced from the third side along the second direction. The conductive pad has a planar side extending in a plane of the second and third directions and the conductive pad is exposed along a portion of the first side. The distal end of the second lead is spaced from the conductive pad by a spacing distance that is greater than or equal to a pitch spacing between the first and second leads.

In a further aspect, a method of fabricating an electronic device includes forming a package structure to enclose portions of a first lead and a second lead, the package structure having a first side, a second side, a third side, and a fourth side, the second side spaced from the first side along a first direction, the fourth side spaced from the third side along a second direction orthogonal to the first direction. The method further includes bending a first portion of the second lead downward toward a plane of the first side and away from a plane of the second side. The method also includes bending a second portion of the second lead inward from the first portion of the second lead in a direction toward the third side such that a bottom surface of the second portion of the second lead is coplanar with a plane of the first side and a distal end of the second lead is spaced from the third side along the second direction.

DETAILED DESCRIPTION

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating.

Figure 1:
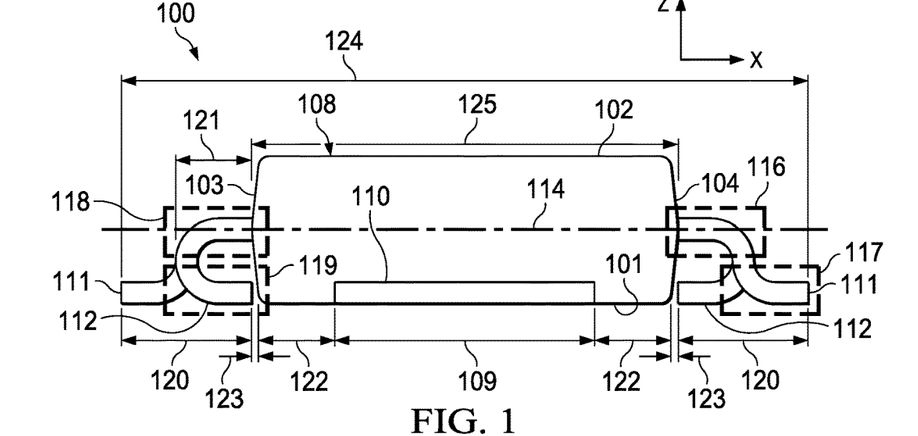
FIG. 1 is a side elevation view of a packaged electronic device having interdigitated outwardly bent first leads and inwardly bent second leads extending out of opposite lateral sides.
Figure 1A:
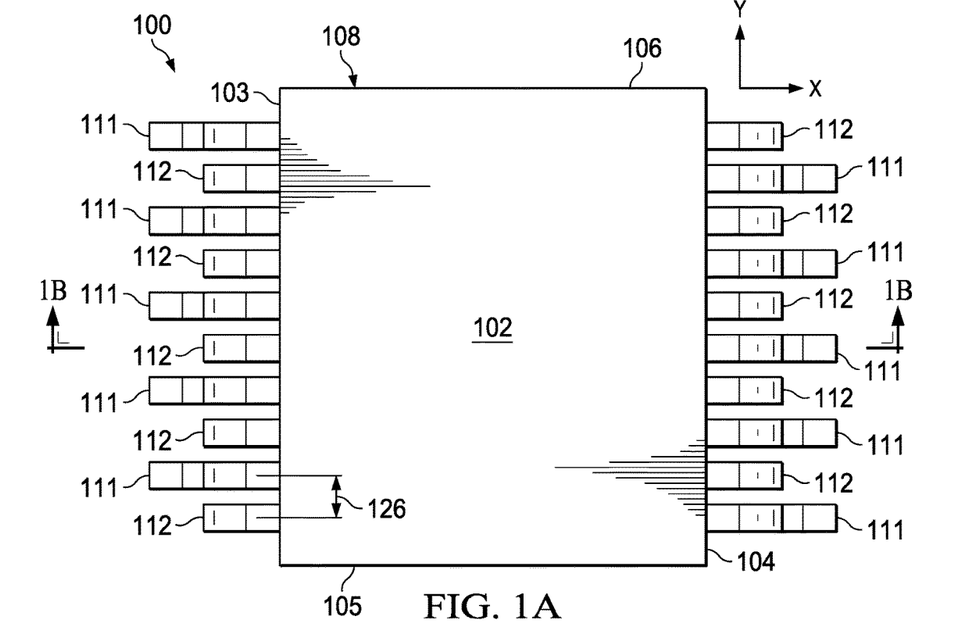
FIG. 1A is a top plan view of the packaged electronic device of FIG. 1.
Figure 1B:
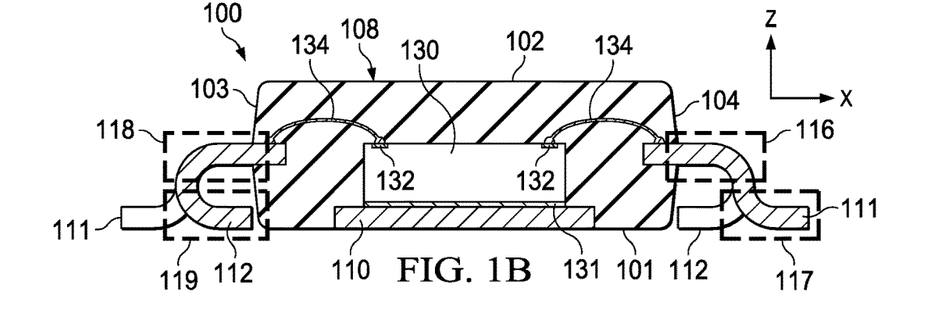
FIG. 1B is a sectional side elevation view of the packaged electronic device of FIGS. 1 and 1A taken along line 1B-1B of FIG. 1A.
Figure 2:
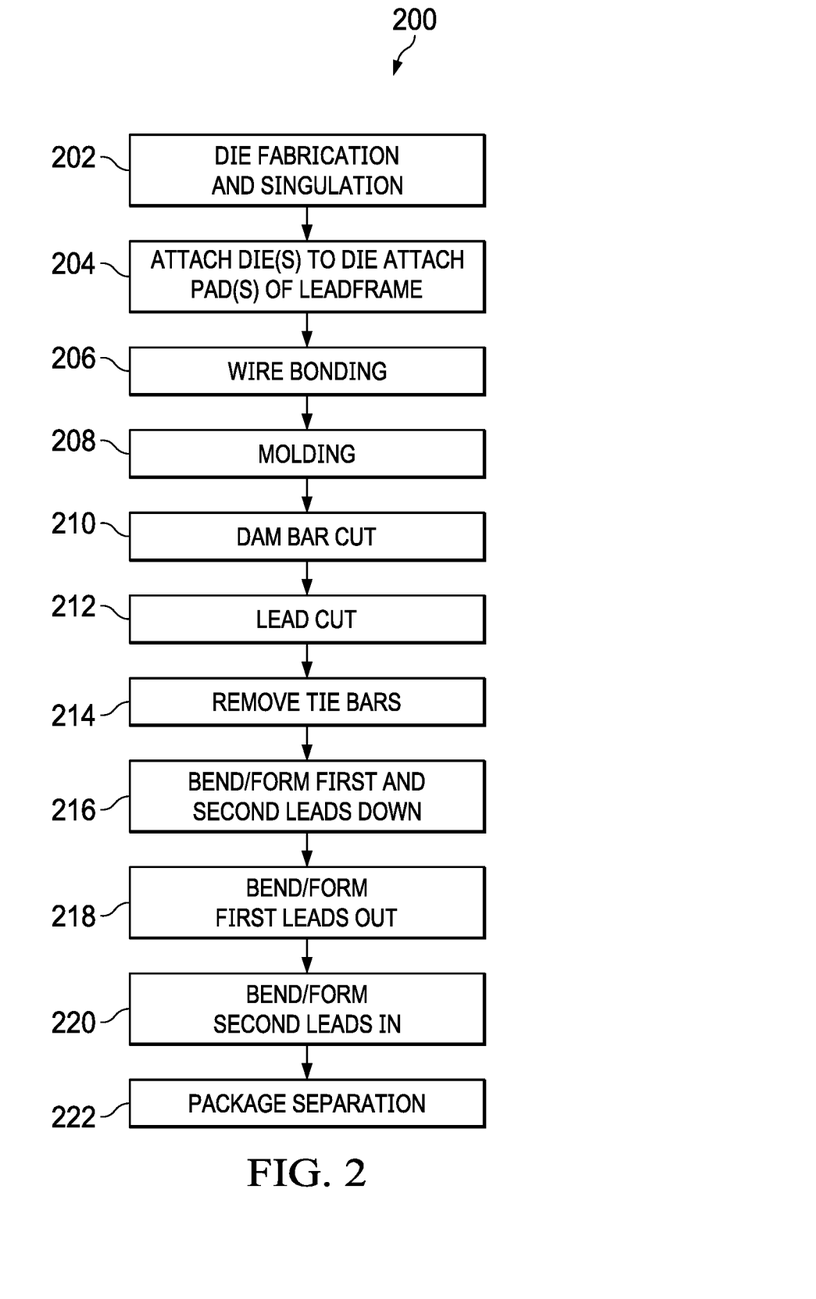
FIG. 2 is a flow diagram of a method of fabricating a packaged electronic device.

Referring to FIGS. 1, 1A and 1B, FIG. 1 shows a side view of a packaged electronic device 100 having interdigitated outwardly and inwardly bent leads, FIG. 1A shows a top view of the packaged electronic device 100 and FIG. 1B shows a section view of the packaged electronic device 100 taken along line 1B-1B of FIG. 1A. The packaged electronic device 100 includes a package structure 108 with a first side 101 (e.g., the bottom side in the illustrated orientation of FIG. 1) and an opposite second side 102 (e.g., top) spaced apart from the first side 101 along a first direction (e.g., the vertical direction Z in FIGS. 1 and 1B). The packaged electronic device 100 also includes a third side 103 (e.g., the lateral left side in FIGS. 1, 1A and 1B) and an opposite fourth side 104 (e.g., right side) spaced apart from the third side 103 along a second direction (e.g., the X direction), where the second direction X is orthogonal to the first direction Z. The packaged electronic device 100 in the illustrated example is generally rectangular and includes lateral ends formed by a fifth side 105 and a sixth side 106 (FIG. 1A). The sixth side 106 is spaced apart from the fifth side 105 along a third direction Y that is orthogonal to the respective first and second directions Z and X. The packaged electronic device 100 in this example has generally flat or planar bottom and top sides 101 and 102. The lateral sides 103-106 are tapered from a mold parting line to facilitate ejection from a mold during fabrication. In other implementations, one or more of the lateral sides 103-106 can be flat or planar and/or one or both sides 101 and 102 can be non-planar.

The packaged electronic device 100 has a conductive pad 110 with a lateral width 109, for example, a thermal pad positioned along the first side 101. The conductive pad 110 in this example has a planar bottom side that extends in a plane of the second and third directions (e.g., an X-Y plane). The planar side of the conductive pad 110 is exposed along a portion of the first side 101 to facilitate soldering to a conductive feature of a host PCB (not shown). In one implementation, the conductive pad 110 is or includes an electrically and thermally conductive metal, such as copper or aluminum. In operation when the packaged electronic device 100 is powered, the conductive pad 110 facilitates thermal cooling of the internal circuitry of the packaged electronic device 100. In this or another example, the conductive pad 110 operates as a ground connection or a circuit node connection for coupling to circuitry of a host PCB, alone or in addition to providing heat removal.

The package structure 108 has a parting line along a lateral X-Y plane 114 and leads that extend out of the lateral third and fourth sides 103 and 104 along the plane 114, although not a requirement of all possible implementations. The parting line in this example is along the vertical middle of the package structure 108, although not a requirement of all possible implementations.

The packaged electronic device 100 includes multiple instances of an outwardly bent first lead 111 and multiple instances of an inwardly bent second lead 112 on both lateral sides 103 and 104 of the package structure 108. This example includes a first set of multiple instances of alternating pairs of the first and second leads 111 and 112 extending outward from the third side 103 and spaced from one another along the third direction Y, as well as a second set of multiple instances of alternating pairs of the first and second leads 111 and 112 extending outward from the fourth side 104 and spaced from one another along the third direction Y.

In this example, multiple pairs of the first and second leads 111 and 112 extend outward from each of the lateral third and fourth sides 103 and 104. The first and second leads 111 and 112 are interdigitated (e.g., alternating) along the third direction Y, as best shown in FIG. 1A. In another implementation, multiple instances of outwardly and inwardly bent interdigitated first and second leads 111 and 112 extend outward from all four lateral sides 103-106 (e.g., FIG. 9 below). In a further implementation, multiple instances of outwardly and inwardly bent interdigitated first and second leads 111 and 112 extend outward from only one lateral side (e.g., FIG. 10 below). In another example, a single pair of outwardly and inwardly bent first and second leads 111 and 112 is provided on a single lateral side of the package structure 108.

The respective leads 111 and 112 in the illustrated example are identical or similar along the lateral sides 103 and 104. For example, the first lead 111 at the illustrated end on the right in FIG. 1 has a first portion 116 and a second portion 117, and the other instances of the first lead on the third side 103 and the fourth side 104 are similarly shaped. The first portion 116 of the first lead 111 extends outward from the lateral fourth side 104 along the second direction X (e.g., to the right in FIG. 1) and downward toward a plane of the bottom or first side 101 and away from a plane of the top or second side 102. The second portion 117 of the first lead 111 extends outward from the first portion 116 of the first lead 111 in a direction away from the fourth side 104.

The instances of the first lead 111 along the third side 103 have similar first and second portions 116 and 117, in which the first portion 116 extends outward from the lateral third side 103 along the second direction X (e.g., to the left in FIG. 1) and downward toward the plane of the first side 101 and away from the plane of the second side 102. The second portion 117 of the first lead 111 extends outward from the first portion 116 of the first lead 111 in a direction away from the third side 103. The first and second portions 116 and 117 in this example form a generally S-shaped profile. One or more different profiles can be used in other implementations, for example, including more or fewer straight segments and/or more or fewer curvilinear segments than are shown in the example of FIGS. 1, 1A and 1B.

The instances of the second lead 112 on both lateral sides 103 and 104 have a first portion 118 and a second portion 119. The individual instances of the second lead 112 are spaced from a neighboring first lead 111 along the third direction Y. With respect to the instances of the second lead 112 on the third side 103, the first portion 118 extends outward from the third side 103 along the second direction X and downward toward the plane of the first side 101 and away from the plane of the second side 102. In one example, the first portion 118 is similarly shaped to the first portion 116 of the first lead 111, although not a requirement of all possible implementations.

Distal ends of the first leads 111 extend outward along the second direction X from the respective sides 103, 104 by a distance 120. The centers of the second leads 112 at the maximum bend location extend outward along the second direction X from the respective sides 103, 104 by a distance 121. The distal ends of the second leads 112 are laterally spaced apart from the closest end of the conductive pad 110 by a spacing distance 122. The second portion 119 of the second lead 112 extends inward from the first portion 118 of the second lead 112 in a direction toward the third side 103.

The distal ends of the second leads 112 are spaced apart from the respective third and fourth sides 103, 104 along the second direction X by a non-zero gap distance 123. For example, the instances of the second lead 112 along the lateral fourth side 104 have a first portion 118 that extends outward from the fourth side 104 along the second direction X (e.g., to the left in FIG. 1) and downward toward the plane of the first side 101 and away from the plane of the second side 102, and the second portion 119 extends inward from the first portion 118 in a direction toward the third side 103 (e.g., to the right in FIG. 1). The lateral extent of the packaged electronic device 100 between the distal ends of the first leads 111 along the second direction X is a distance 124. The package structure has a lateral width 125 along the second direction X. As shown in FIG. 1A, the centers of neighboring first and second leads 111 and 112 are spaced by a pitch distance 126.

As shown in FIG. 1B, the packaged electronic device 100 includes a semiconductor die 130 with a bottom side attached to a top side of the conductive pad 110 by a conductive epoxy or solder 131 to provide thermal coupling of the die 130 to the conductive pad 110. The semiconductor die 130 includes top side conductive bond pads 132. One or more of the conductive bond pads 132 are electrically coupled to respective ones of the first and second leads 111 and 112 by conductive bond wires 134 to provide electrical connection to circuitry of a host PCB (not shown) to which the packaged electronic device 100 is soldered.

In one example, the nominal lead pitch distance 126 of the first and second leads 111 and 112 is 0.3 mm to provide a nominal pitch distance of 0.6 mm between neighboring ones of the first leads 111 and a pitch distance of 0.6 mm between neighboring ones of the second leads 112. In this example, the package width 125 is approximately 3 mm, the width 109 of the conductive pad 110 is 1.9 mm, and the package structure has a lateral width 125 of 5 mm. In this example, the non-zero gap distance 123 is 0.21 mm+/−0.1 mm, and the centers of the first portions 116 and 118 of the respective first and second leads 111 and 112 are 0.525 mm down from the top or second side 102 of the package structure 108. The spacing distance 120 between the distal ends of the first leads 111 and the respective sides 103, 104 is 1 mm+/−0.1 mm. These dimensions can vary according to manufacturing tolerances, for example, +/−2%.

In another example, the nominal lead pitch distance 126 of the first and second leads 111 and 112 is 0.325 mm to provide a nominal pitch distance of 0.65 mm between neighboring ones of the first leads 111 and a pitch distance of 0.65 mm between neighboring ones of the second leads 112. In this example, the package width 125 is approximately 3 mm, and the non-zero gap distance 123 is 0.21 mm+/−0.1 mm. In this example, the width 109 of the conductive pad 110 is 2.1 mm+/−0.1 mm, the package structure has a lateral width 125 of 5 mm, and the centers of the first portions 116 and 118 of the respective first and second leads 111 and 112 are 0.525 mm down from the top or second side 102 of the package structure 108. The spacing distance 120 between the distal ends of the first leads 111 and the respective sides 103, 104 is 1 mm+/−0.1 mm. These dimensions can vary according to manufacturing tolerances, for example, +/−2%.

Figure 11:
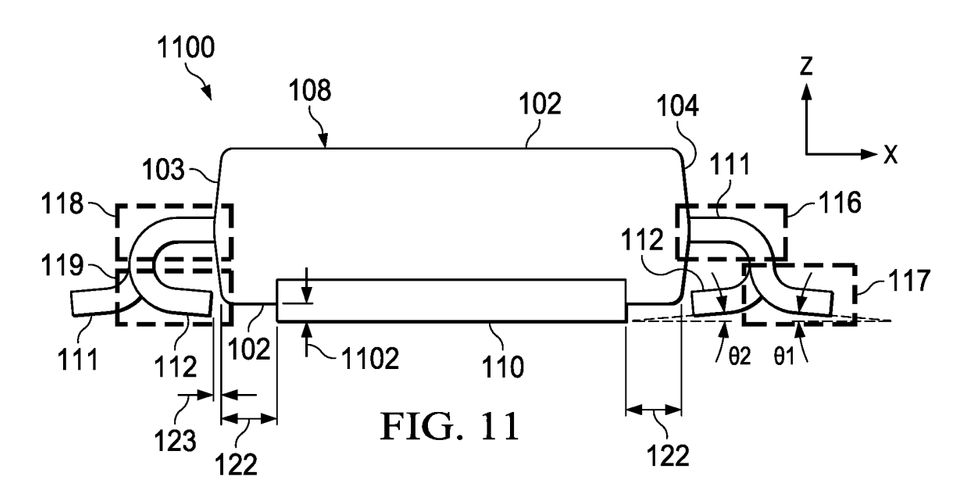
FIG. 11 is a side elevation view of another packaged electronic device having interdigitated outwardly bent first leads and inwardly bent second leads extending out of opposite lateral sides.

The bottom surfaces of the respective first and second leads 111 and 112 are coplanar with one another. In other examples, the bottom surfaces of the respective first and second leads 111 and 112 are non-coplanar and one or both can be at a non-zero angle relative to the X-Y plane of the second and third directions, for example, as shown in FIG. 11 below.

Unlike J-type leads, the instances of the second lead 112 do not extend under the bottom of the packaged electronic device. Rather, the distal end of the second lead 112 is laterally spaced from the respective lateral first or forth side 103, 104 by the non-zero gap distance 123 shown in FIG. 1. In this implementation, moreover, the bottom surfaces of the first and second leads 111, 112 are coplanar with the exposed planar side of the conductive pad 110.

In other examples, the bottom surfaces of the respective first and second leads 111 and 112 are non-coplanar with the bottom side of the conductive pad 110. The bottom surfaces of the respective first and second leads 111 and 112 can be at a vertical level above or below that of the bottom of the conductive pad 110 in other implementation and can be at a non-zero angle relative to the X-Y plane of the second and third directions.

As previously described, the packaged electronic device 100 includes a bottom side conductive pad 110. In one example, the distal ends of the second leads 112 are spaced from the conductive pad 110 by a lateral spacing distance 122 that is greater than or equal to the pitch distance 126 between neighboring ones of the first and second leads 111 and 112 of the respective pairs. In one example, the lateral spacing distance 122 is 0.598 mm+/−0.15 mm. In one example, the pitch distance 126 between neighboring ones of the first and second leads 111 and 112 is 0.6 mm+/−0.15 mm.

Figures 3, 4:
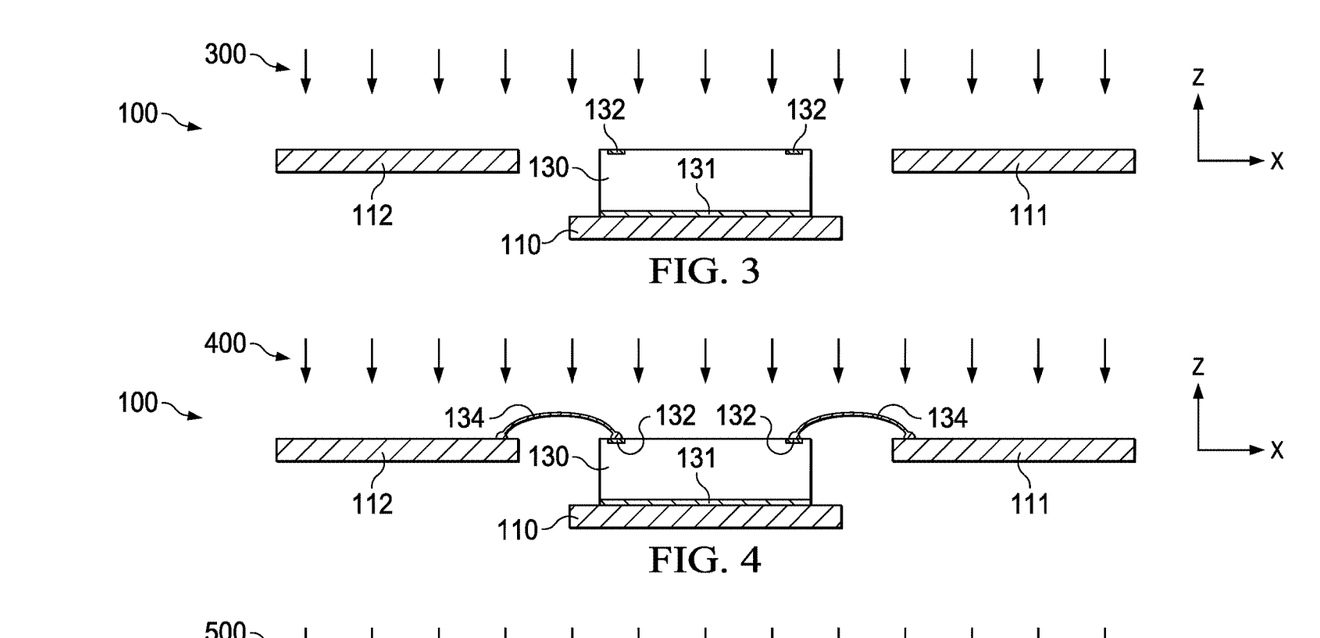
FIGS. 3-8 are sectional side elevation views of the packaged electronic device of FIGS. 1-1B undergoing fabrication processing according to the method of FIG. 2.

Referring now to FIGS. 2-8, FIG. 2 shows a method 200 of fabricating a packaged electronic device and FIGS. 3-8 show side views of the packaged electronic device 100 undergoing fabrication processing according to the method 200. In one example, the semiconductor device fabrication uses standard processing steps with a modified process after lead trimming to form inwardly and outwardly extending leads (e.g., leads 111 and 112 in FIGS. 1-1B). The method 200 begins in FIG. 2 with die fabrication and die singulation at 202, for example, to produce the semiconductor die 130 in FIG. 3. The method 200 continues at 204 with providing a lead frame with leads and one or more die attach pads. FIG. 3 shows unbent leads 111 and 112, and the conductive pad 110 which operates as a die attach to support the semiconductor die 130. In one example, the starting lead frame includes an array with multiple sections that respectively correspond to a finished electronic device, and multiple sections may be processed concurrently. The lead frame including the unbent leads 111 and 112 and the conductive pad 110 initially constitute a unitary copper structure formed by suitable stamping operations, which may include features at different levels as in the illustrated example. In one example, the starting lead frame includes one or more support arms (not shown) that support the conductive pad 110. Such support arm or arms can be connected to portions of the lead frame to support the conductive pad 110 during and after manufacturing or can be removed during manufacturing. In another example, the conductive pad 110 is supported relative to the unbent lead portions 111 and 112 using an adhesive carrier or tape (not shown).

The method 200 continues at 204 with attaching the semiconductor die(s) to the die attach pad(s). In the example of FIG. 3, the semiconductor die 130 is mounted to the conductive pad 110 by a die attach process 300 using any suitable adhesive attachment materials, soldering, etc. The method 200 continues at 206 in FIG. 2 with wire bonding. FIG. 4 shows one example where a wire bonding process 400 is performed that forms electrical connections by bond wires 134 between the semiconductor die 130 and the first portions of respective first and second leads 111 and 112.

Figure 5:
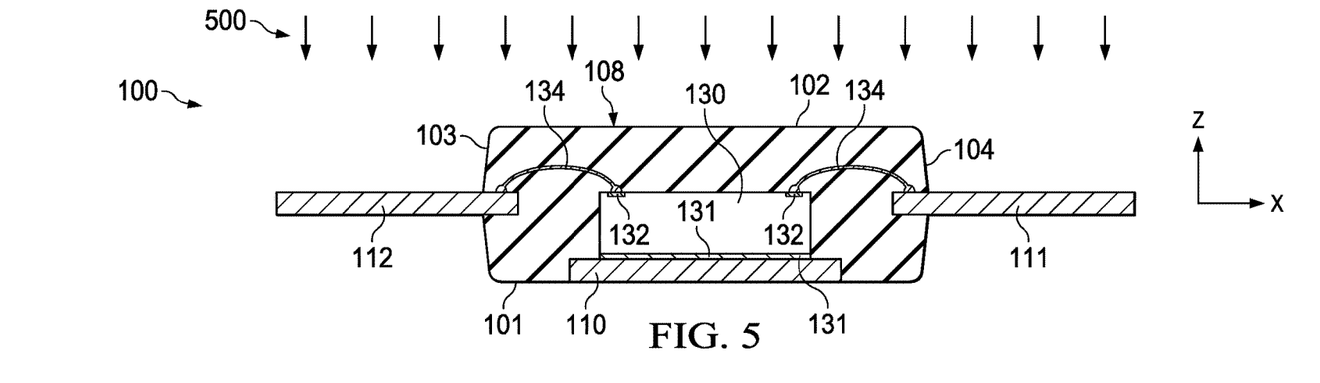

The method 200 continues at 208 with forming the package structure 108 to enclose portions of the first lead 111 and the second lead 112. FIG. 5 shows the packaged electronic device 100 undergoing a molding process 500. The process 500 forms the package structure 108 having the sides 101-106 shown and described above in connection with FIGS. 1-1B, and the molded package structure 108 encloses the upper portion of the conductive pad 110, the semiconductor die 130, the bond wires 134 and interior portions of the first and second leads 111 and 112. In one example, the method 200 also includes dam bar cutting at 210 to remove copper dam bar features between the lead locations of a repeating lead pitch pattern. During the molding at 208, the dam bar features (not shown) mitigate or prevent outflow of molding material, after which the dam bar features are removed at 210.

Figure 6:
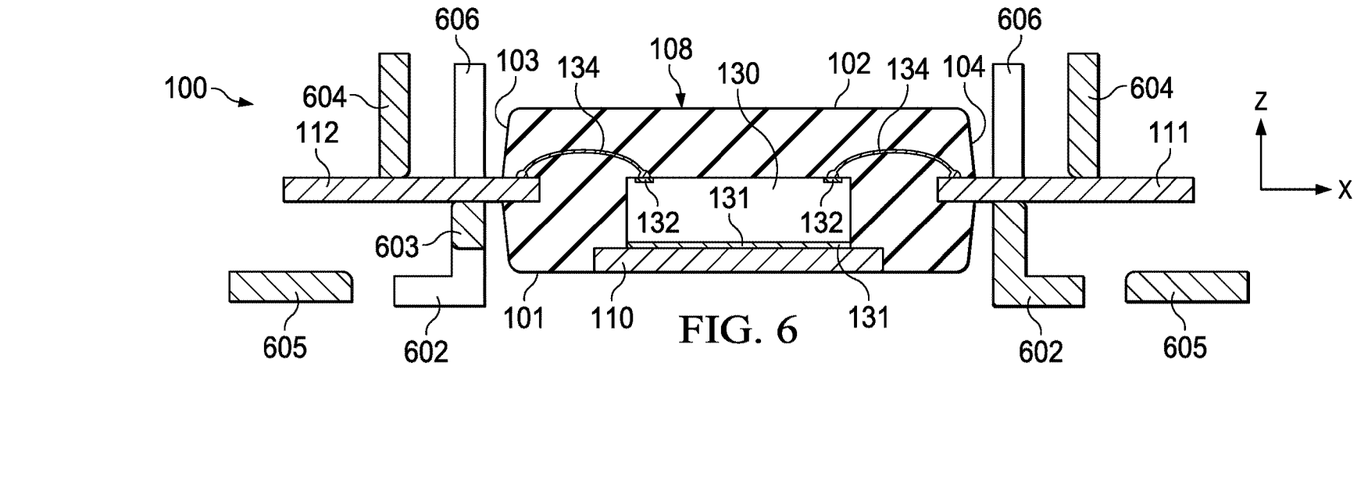

The method continues at 212 with lead trimming or cutting with a lead cut process that cuts ends of the leads and leaves the generally flat unbent leads as shown in the front view of FIG. 6. In certain implementations, the method 200 also includes removal of any included tie bars at 214.

Figure 7:
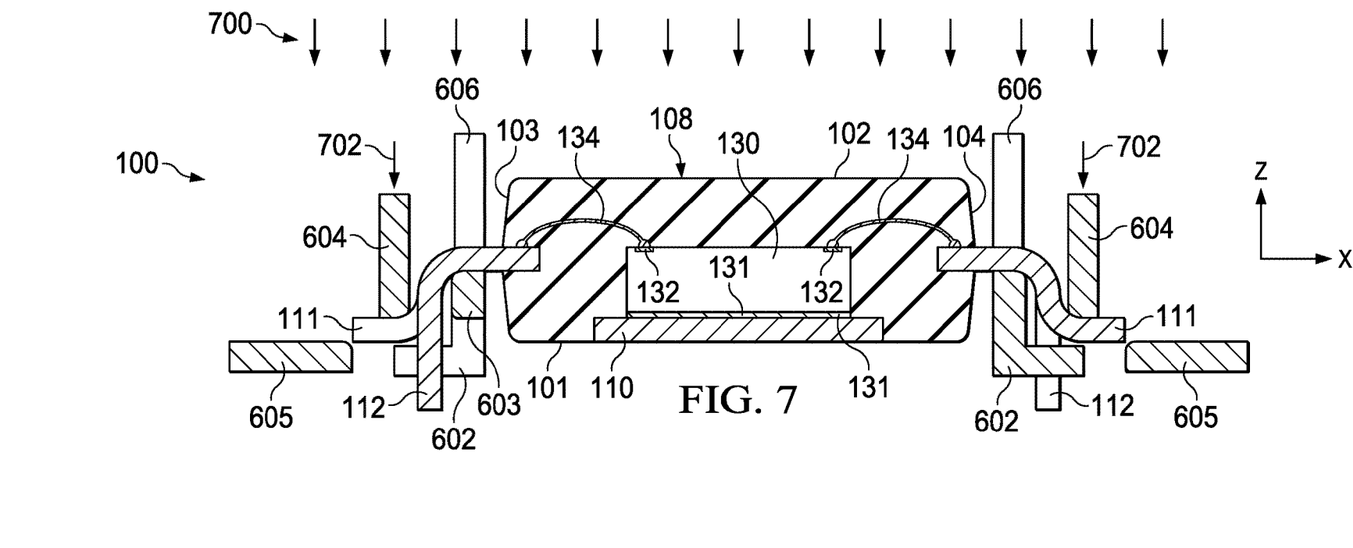

The method 200 further includes lead forming at 216, 218 and 220 to bend or otherwise form the external portions of the trimmed leads 111 and 112 into non-planar shapes. In one example, the external portions of the first leads 111 outside the package structure 108 are formed into gull wing shapes as seen in FIG. 1. The lead forming operation in one example is performed in two stages, including a first step that bends the first portions 116 and 118 of the first and second leads 111 and 112 down at 216 in a single bending or forming process using appropriate tooling. FIGS. 6 and 7 show one example of the bend processing at 216 using an anvil 602 positioned below the first portions of the first leads 111 and a second anvil 603 positioned below the second leads 112, as well as a first punch 604 positioned above the first and second leads 111 and 112, and a clamp 606 positioned above the first portions of the leads 111 and 112.

FIG. 7 illustrates the packaged electronic device 100 undergoing a bending process 700 using the tooling (e.g., anvil 602, second anvil 603, first punch 604 and clamp 606, in which the first punch 604 is moved downward along the direction of arrows 702. The downward movement of the punch 604 relative to the anvil 602 and the clamp 606 forms and bends the first portions 116 and 118 of the respective first and second leads 111 and 112 downward to extend the respective second lead portions from the respective first portions toward the plane of the bottom or first side 101 and away from the plane of the top or second side 102 of the package structure 108. The process 700 in this example bends the first portion 116 of the first lead 111 downward toward the plane of the first side 101 and away from a plane of the second side 102, and concurrently bends the first portion 118 of the second lead 112 downward toward the plane of the first side 101 and away from the plane of the second side 102.

The method 200 also includes bending the second portion 117 of the first lead 111 outward at 218. The example tooling and process 700 in FIGS. 6 and 7 bends the second portion 117 of the first lead 111 outward from the first portion 116 of the first lead 111 in the direction away from the third side 103 such that the bottom surface of the second portion 117 of the first lead 111 is coplanar with the plane of the first side 101. The illustrated tooling thus uses a single bending process 700 to bend the first and second portions 116 and 117 of the first lead 111. In other examples, different tooling is used and may involve separate processes to bed the respective first and second portions 116 and 117 of the first leads 111.

Figure 8:
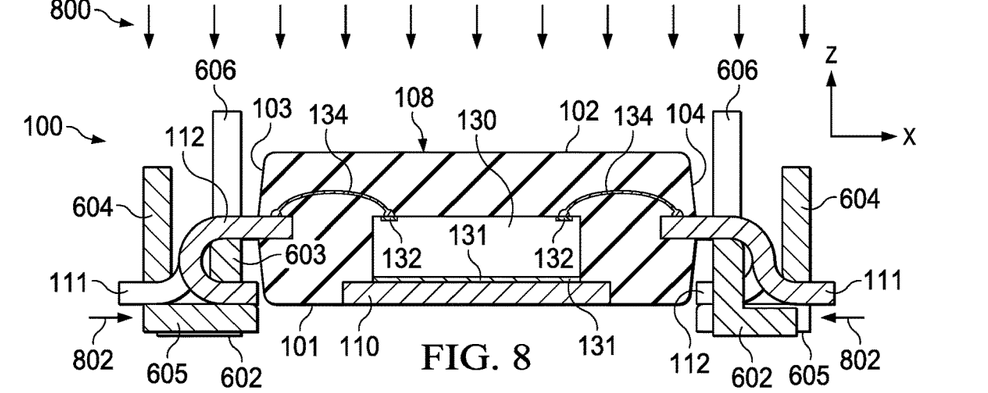

At 220, the method continues with bending the second portion 119 of the respective second leads 112 inward from the first portions 118 thereof. FIG. 8 shows one example using a second bending process 800 that moves the second punch 605 inward along the directions of the arrows 802 to bend the second lead 112 on the right in FIG. 8 in a direction toward the third side 103 and to concurrently bend the second leads 112 on the left side inward toward the fourth side 104 such that a bottom surface of the second portions 119 of the second leads 112 are coplanar with the plane of the bottom or first side 101 of the package structure 108. The process 800 also ensures that the distal ends of the second leads 112 are spaced from the respective third and fourth sides 103 and 104 along the second direction X. The method 200 further includes package separation, for example, by saw or laser cutting (not shown) and the resulting packaged electronic device 100 is shown in FIGS. 1-1B discussed above.

Figure 9:
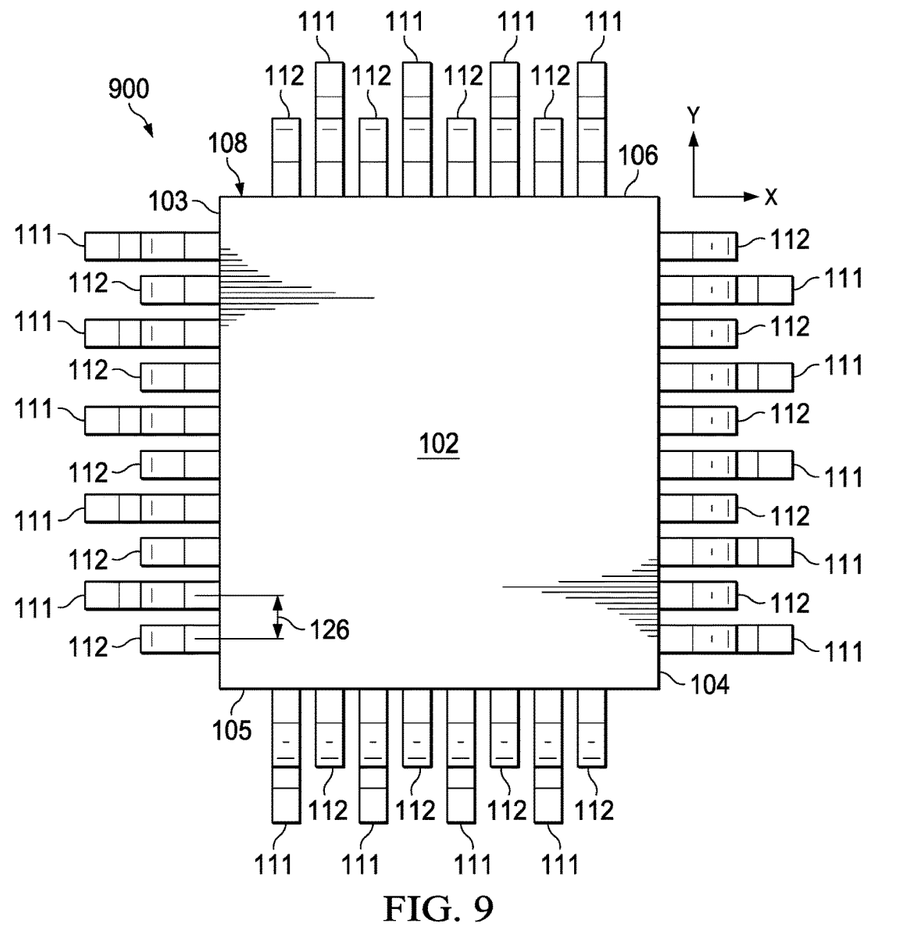
FIG. 9 is a top plan view of another packaged electronic device having interdigitated outwardly bent first leads and inwardly bent second leads extending out of four lateral sides.

FIG. 9 shows another example packaged electronic device 900 with interdigitated outwardly bent first leads 111 and inwardly bent second leads 112 extending out of four lateral sides 103, 104, 105 and 106 of the package structure 108, in which similarly numbered structures, dimensions and features are as described above in connection with the packaged electronic device 100 of FIGS. 1-1B. In this example, the packaged electronic device 900 includes a first set of multiple instances of alternating pairs of the first and second leads 111 and 112 that extend outward from the third side 103 and are spaced from one another along the third direction Y, as well as a second set of multiple instances of alternating pairs of the first and second leads 111 and 112 that extend outward from the fourth side 104 and are spaced from one another along the third direction Y, where the individual first leads 111 and the individual second leads 112 are as described previously. The packaged electronic device 900 also includes a third set of multiple instances of alternating pairs of the first and second leads 111 and 112 that extend outward from the fifth side 105 and are spaced from one another along the second direction X. In addition, the packaged electronic device 900 in FIG. 9 includes a fourth set of multiple instances of alternating pairs of the first and second leads 111 and 112 that extend outward from the sixth side 106 and are spaced from one another along the second direction X. In one example, the packaged electronic device 900 has a conductive pad 110 as described and shown above in connection with FIGS. 1-1B. In another implementation, the conductive pad 110 is omitted from the packaged electronic device 900.

Figure 10:
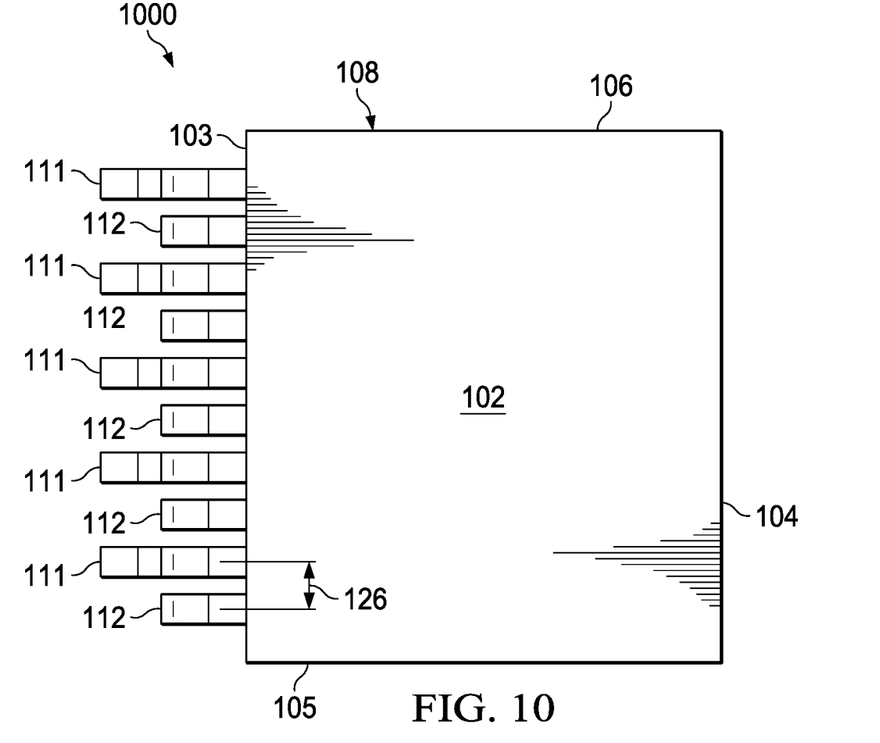
FIG. 10 is a top plan view of another packaged electronic device having interdigitated outwardly bent first leads and inwardly bent second leads extending out of one lateral side.

FIG. 10 shows another example packaged electronic device 1000 with interdigitated outwardly bent first leads 111 and inwardly bent second leads 112 extending out of a single lateral side 103. The packaged electronic device 1000 includes interdigitated outwardly bent first leads 111 and inwardly bent second leads 112 extending out of the third side 103 of the package structure 108, in which similarly numbered structures, dimensions and features are as described above in connection with the packaged electronic device 100 of FIGS. 1-1B. In one example, the packaged electronic device 1000 has a conductive pad 110 as described and shown above in connection with FIGS. 1-1B. In another implementation, the conductive pad 110 is omitted from the packaged electronic device 1000. In another possible example (not shown), the package structure 108 has four lateral sides 103-106 as previously shown and described and interdigitated outwardly bent first leads 111 and inwardly bent second leads 112 extend out of three of the lateral sides, with or without a bottom side conductive pad 110.

FIG. 11 shows a side view of another packaged electronic device 1100 with interdigitated outwardly bent first leads 111 and inwardly bent second leads 112 that extend out of opposite lateral sides 103 and 104. The packaged electronic device 1100 includes interdigitated outwardly bent first leads 111 and inwardly bent second leads 112 extending out of two lateral sides 103 and 104 of the package structure 108, in which similarly numbered structures, dimensions and features are as described above in connection with the packaged electronic device 100 of FIGS. 1-1B. Unlike the device in FIGS. 1-1B, the planar bottom side of the conductive pad 110 and the bottoms of the leads 111 and 112 extend outward below the first side 101 of the package structure 108 by a spacing distance 1102 along the first direction Z in the packaged electronic device 1100 of FIG. 11. Also, the bottoms of the leads 111 and 112 and the distal ends thereof are not strictly coplanar with the X-Y plane of the bottom of the conductive pad 110, and instead are at respective first and second non-zero angles θ1 and θ2.

The described examples allows the package structure 108 to shrink and have a reduced pitch while staggering the landing of adjacent leads 111 and 112 to increase pin count per unit length of the packaged electronic device 100, 900, 1000 and 1100. Interdigitating inward and outward packages helps to keeps the pitch in two separate planes to facilitate shrinking the package while meeting minimum mitch specifications for a particular application (e.g., 0.5 mm minimum pitch). Manufacturing cost can be reduced by the resulting increase in units per strip. The described examples also facilitate the provision of bottom side thermal pads or ground connections (e.g., the conductive pad 110 above) by not having the inwardly extending second leads 112 go underneath the package structure 108 and provides a controllable gap distance therebetween to satisfy any minimum spacing requirements (e.g., spacing distance 122 in FIG. 1). The second leads 112 provide significant advantages compared to J-type leads, particularly for automotive or high-power implementations that include the conductive pad 110 for improved thermal cooling alone or in combination with package size and cost reduction. Moreover, unlike J-type leaded parts where the leads extend under the package, the leads do not go under the package in the described solutions and the package height can be reduced for parts going into more compact environments and applications.

Modifications are possible in the described examples, and other implementations are possible, within the scope of the claims.

What is claimed is:

1. An electronic device, comprising:
   a package structure having a first side, a second side, a third side, and a fourth side, the second side spaced from the first side along a first direction, the fourth side spaced from the third side along a second direction, the second direction orthogonal to the first direction,
   a first lead having a first portion and a second portion, the first portion of the first lead extending outward from the third side along the second direction and downward toward a plane of the first side and away from a plane of the second side, and the second portion of the first lead extending outward from the first portion of the first lead in a direction away from the third side; and
   a second lead having a first portion and a second portion, the second lead spaced from the first lead along a third direction, the third direction orthogonal to the first and second directions, the first portion of the second lead extending outward from the third side along the second direction and downward toward the plane of the first side and away from the plane of the second side, and the second portion of the second lead extending inward from the first portion of the second lead in a direction toward the third side, and a distal end of the second lead being spaced from the third side along the second direction by a non-zero gap distance.

2. The electronic device of claim 1, comprising a first set of multiple instances of alternating pairs of the first and second leads extending outward from the third side and spaced from one another along the third direction.

3. The electronic device of claim 2, comprising a second set of multiple instances of alternating pairs of the first and second leads extending outward from the fourth side and spaced from one another along the third direction, wherein:
   the individual first leads of the second set include a first portion and a second portion, the first portion of the first lead extending outward from the fourth side along the second direction and downward toward the plane of the first side and away from the plane of the second side, and the second portion of the first lead extending outward from the first portion of the first lead in a direction away from the fourth side; and
   the individual second leads of the second set include a first portion and a second portion, the second lead spaced from the first lead along the third direction, the first portion of the second lead extending outward from the fourth side along the second direction and downward toward the plane of the first side and away from the plane of the second side, and the second portion of the second lead extending inward from the first portion of the second lead in a direction toward the fourth side, and a distal end of the second lead being spaced from the fourth side along the second direction.

4. The electronic device of claim 3, wherein:
   the package structure further comprises a fifth side and a sixth side, the sixth side spaced from the fifth side along the third direction;
   the electronic device further comprises a third set of multiple instances of alternating pairs of the first and second leads extending outward from the fifth side and spaced from one another along the second direction;
   the individual first leads of the third set include a first portion and a second portion, the first portion of the first lead extending outward from the fifth side along the third direction and downward toward the plane of the first side and away from the plane of the second side, and the second portion of the first lead extending outward from the first portion of the first lead in a direction away from the fifth side;
   the individual second leads of the third set include a first portion and a second portion, the second lead spaced from the first lead along the second direction, the first portion of the second lead extending outward from the fifth side along the third direction and downward toward the plane of the first side and away from the plane of the second side, and the second portion of the second lead extending inward from the first portion of the second lead in a direction toward the fifth side, and a distal end of the second lead being spaced from the fifth side along the third direction;
   the electronic device further comprises a fourth set of multiple instances of alternating pairs of the first and second leads extending outward from the sixth side and spaced from one another along the second direction;
   the individual first leads of the fourth set include a first portion and a second portion, the first portion of the first lead extending outward from the sixth side along the third direction and downward toward the plane of the first side and away from the plane of the second side, and the second portion of the first lead extending outward from the first portion of the first lead in a direction away from the sixth side; and
   the individual second leads of the fourth set include a first portion and a second portion, the second lead spaced from the first lead along the second direction, the first portion of the second lead extending outward from the sixth side along the third direction and downward toward the plane of the first side and away from the plane of the second side, and the second portion of the second lead extending inward from the first portion of the second lead in a direction toward the sixth side, and a distal end of the second lead being spaced from the sixth side along the third direction.

5. The electronic device of claim 4, further comprising a conductive pad having a planar side extending in a plane of the second and third directions and exposed along a portion of the first side, the distal ends of the second leads being spaced from the conductive pad by a spacing distance that is greater than or equal to a pitch spacing between the first and second leads of the respective pairs.

6. The electronic device of claim 5, wherein bottom surfaces of the first and second leads are coplanar with the planar side of the conductive pad.

7. The electronic device of claim 4, wherein bottom surfaces of the first and second leads are coplanar with one another.

8. The electronic device of claim 3, further comprising a conductive pad having a planar side extending in a plane of the second and third directions and exposed along a portion of the first side, the distal ends of the second leads being spaced from the conductive pad by a spacing distance that is greater than or equal to a pitch spacing between the first and second leads of the respective pairs.

9. The electronic device of claim 3, wherein bottom surfaces of the first and second leads are coplanar with one another.

10. The electronic device of claim 1, further comprising a conductive pad having a planar side extending in a plane of the second and third directions and exposed along a portion of the first side, the distal end of the second lead being spaced from the conductive pad by a spacing distance that is greater than or equal to a pitch spacing between the first and second leads.

11. The electronic device of claim 10, wherein bottom surfaces of the first and second leads are coplanar with the planar side of the conductive pad.

12. The electronic device of claim 1, wherein bottom surfaces of the first and second leads are coplanar with one another.

13. An electronic device, comprising:
a package structure having a first side, a second side, a third side, and a fourth side, the second side spaced from the first side along a first direction, the fourth side spaced from the third side along a second direction, the second direction orthogonal to the first direction,
a first lead extending outward from the third side along the second direction;
a second lead having a first portion and a second portion, the second lead spaced from the first lead along a third direction, the third direction orthogonal to the first and second directions, the first portion of the second lead extending outward from the third side along the second direction and downward toward the plane of the first side and away from the plane of the second side, and the second portion of the second lead extending inward from the first portion of the second lead in a direction toward the third side, and a distal end of the second lead being spaced from the third side along the second direction; and
a conductive pad having a planar side extending in a plane of the second and third directions and exposed along a portion of the first side, the distal end of the second lead being spaced from the conductive pad by a spacing distance that is greater than or equal to a pitch spacing between the first and second leads.

14. The electronic device of claim 13, comprising: a first set of multiple instances of alternating pairs of the first and second leads extending outward from the third side and spaced from one another along the third direction; and a second set of multiple instances of alternating pairs of the first and second leads extending outward from the fourth side and spaced from one another along the third direction, the individual first leads of the second set extending outward from the fourth side along the second direction;
wherein the individual second leads of the second set include a first portion and a second portion, the second lead spaced from the first lead along the third direction, the first portion of the second lead extending outward from the fourth side along the second direction and downward toward the plane of the first side and away from the plane of the second side, and the second portion of the second lead extending inward from the first portion of the second lead in a direction toward the fourth side, and a distal end of the second lead being spaced from the fourth side along the second direction; and
the distal end of the second leads spaced from the conductive pad by the spacing distance.

15. The electronic device of claim 13, wherein bottom surfaces of the first and second leads are coplanar with the planar side of the conductive pad.

16. The electronic device of claim 13, wherein bottom surfaces of the first and second leads are coplanar with one another.

17. A method of fabricating an electronic device, the method comprising:
forming a package structure to enclose portions of a first lead and a second lead having a shape different from the first lead, the package structure having a first side, a second side, a third side, and a fourth side, the second side spaced from the first side along a first direction, the fourth side spaced from the third side along a second direction, the second direction orthogonal to the first direction;
bending a first portion of the second lead downward toward a plane of the first side and away from a plane of the second side; and
bending a second portion of the second lead inward from the first portion of the second lead in a direction toward the third side such that a bottom surface of the second portion of the second lead is coplanar with a plane of the first side and a distal end of the second lead is spaced from the third side along the second direction by a non-zero gap distance.

18. The method of claim 17, further comprising:
bending a first portion of the first lead downward toward the plane of the first side and away from the plane of the second side; and
bending a second portion of the first lead outward from the first portion of the first lead in a direction away from the third side such that a bottom surface of the second portion of the first lead is coplanar with the plane of the first side.

19. The method of claim 18, comprising using a single bending process to bend the first portions of the first and second leads downward.

20. The method of claim 17, comprising using a single bending process to bend the first and second portions of the first lead.

* * * * *